(12) United States Patent
Lyons

(10) Patent No.: US 12,025,636 B2
(45) Date of Patent: Jul. 2, 2024

(54) PROBE FOR A TEST SYSTEM

(71) Applicant: Teradyne, Inc., North Reading, MA (US)

(72) Inventor: Timothy D. Lyons, Stoughton, MA (US)

(73) Assignee: TERADYNE, INC., North Reading, MA (US)

(*) Notice: Subject to any disclaimer, the term of this patent is extended or adjusted under 35 U.S.C. 154(b) by 9 days.

(21) Appl. No.: 17/577,740

(22) Filed: Jan. 18, 2022

(65) Prior Publication Data

US 2023/0228794 A1 Jul. 20, 2023

(51) Int. Cl.
G01R 1/067 (2006.01)
G01R 31/28 (2006.01)

(52) U.S. Cl.
CPC ...... G01R 1/06711 (2013.01); G01R 31/2889 (2013.01)

(58) Field of Classification Search
CPC ............ G01R 1/06711; G01R 31/2889; G01R 31/2893; G01R 31/06; G01R 31/28
See application file for complete search history.

(56) References Cited

U.S. PATENT DOCUMENTS

| | | | | |
|---|---|---|---|---|
| 3,496,464 A * | 2/1970 | Tankersley | ....... | G01R 31/31924 324/73.1 |
| 3,931,506 A * | 1/1976 | Borrelli | ............ | G01R 31/31915 714/724 |
| 4,731,577 A * | 3/1988 | Logan | ................ | G01R 1/07342 324/755.02 |
| 5,933,019 A * | 8/1999 | Depue | ................ | G01R 1/07392 324/763.01 |
| 6,329,892 B1 * | 12/2001 | Wohlfarth | ............... | H01H 51/28 361/88 |
| 6,392,866 B1 * | 5/2002 | Dinteman | ............ | G01R 31/319 324/756.07 |

(Continued)

FOREIGN PATENT DOCUMENTS

| | | |
|---|---|---|
| CN | 112782561 | 5/2021 |
| JP | 2007-198758 | 8/2007 |
| KR | 10-2013-0049724 | 5/2013 |

OTHER PUBLICATIONS

International Search Report and Written Opinion in Application No. PCT/US2023/010680 dated May 16, 2023, 9 pages.

*Primary Examiner* — Jermele M Hollington
*Assistant Examiner* — Suresh K Rajaputra
(74) *Attorney, Agent, or Firm* — Burns & Levinson LLP

(57) ABSTRACT

An example probe for a test system includes a conductor to carry direct current (DC) signals between a DC testing resource and a signal trace on the test system, where the signal trace is for carrying the DC signals and alternating current (AC) signals to and from a device under test; and an inductor connected in series with the conductor. A mechanism is included in the probe for enabling the conductor to move toward the signal trace or a pin electrically connected to the signal trace to create an electrical connection between the conductor and the signal trace to enable the testing resource to transmit the DC signals to the signal trace, and to move away from the signal trace or the pin so that no electrical connection is created between the conductor and the signal trace when the DC signals are not to be transmitted to the signal trace.

20 Claims, 6 Drawing Sheets

(56) References Cited

U.S. PATENT DOCUMENTS

| | | | |
|---|---|---|---|
| 8,717,053 B2 | 5/2014 | Goeke et al. | |
| 2004/0090238 A1* | 5/2004 | Hayden | G01R 1/06738 |
| | | | 324/754.07 |
| 2005/0225382 A1* | 10/2005 | Miller | G01R 31/31905 |
| | | | 327/551 |
| 2008/0042673 A1 | 2/2008 | Hayden et al. | |
| 2010/0013503 A1* | 1/2010 | Huebner | G01R 31/31926 |
| | | | 324/757.03 |

* cited by examiner

PROBE FOR A TEST SYSTEM

TECHNICAL FIELD

This specification describes example implementations of a probe for a test system.

BACKGROUND

Test systems are configured to test the operation of electronic devices referred to as devices under test (DUTs). A test system may include test instruments to send signals, including digital signals, to a DUT for testing. The signals may include high-frequency signals such as alternating current (AC) signals and low-frequency signals such as direct current (DC) signals.

SUMMARY

An example probe for a test system includes a conductor configured to carry direct current (DC) signals between a DC testing resource and a signal trace on the test system, where the signal trace is for carrying the DC signals and alternating current (AC) signals to and from a device under test (DUT); and an inductor connected in series with the conductor, where the inductor is for inhibiting transmission of the AC signals and for allowing transmission of the DC signals. A mechanism is included in the probe for enabling the conductor to move toward the signal trace or a pin electrically connected to the signal trace to create an electrical connection between the conductor and the signal trace to enable the testing resource to transmit the DC signals to the signal trace, and to move away from the signal trace or the pin so that no electrical connection is created between the conductor and the signal trace when the DC signals are not to be transmitted to the signal trace. The probe may include one or more of the following example features, either alone or in combination.

The inductor may be configured to block the AC signals on the conductor. The mechanism may be configured to enable the conductor to move away from the signal trace or the pin when the AC signals are applied to the signal trace by an AC testing resource. The mechanism may include a magnetic coil to generate a magnetic field that interacts with the conductor to cause the conductor to move toward or away from the signal trace or the pin. The mechanism may include an actuator connected to the conductor. The actuator may be configured to enable the conductor to move toward or away from the signal trace or the pin.

The inductor may be part of the DC testing resource. The probe may be part of an edge connector to a printed circuit board (PCB) that contains the signal trace. The PCB may be a device interface board (DIB), may be part of a module connected to the DIB, or may be part of a test instrument in the test system. The electrical connection may be formed by physical contact between the conductor and the signal trace. The AC signals may be at 20 gigabits-per-second (Gbps)/10 gigahertz (GHz) or greater.

An example test system includes a direct current (DC) testing resource for exchanging DC signals with a device under test (DUT) over a signal trace, an alternating current (AC) testing resource for exchanging AC signals with the DUT over the signal trace, and one or more probes. A probe among the one or more probes includes a conductor configured to carry the DC signals between the DC testing resource and the signal trace, and an inductor connected in series with the conductor, where the inductor is for inhibiting transmission of the AC signals and for allowing transmission of the DC signals. A controller is included in the test system for controlling the conductor to move toward the signal trace or a pin electrically connected to the signal trace to create an electrical connection between the conductor and the signal trace to enable the testing resource to transmit the DC signals to the signal trace, and to move away from the signal trace or the pin so that no electrical connection is created between the conductor and the signal trace when the DC signals are not to be transmitted to the signal trace. The test system may include one or more of the following example features, either alone or in combination.

The one or more probes may include N (N>1) probes. Each of the N probes may include: an $N^{th}$ conductor configured to carry DC signals between an $N^{th}$ DC testing resource and an $N^{th}$ signal trace, and an $N^{th}$ inductor connected in series with the $N^{th}$ conductor. The $N^{th}$ inductor may be for inhibiting transmission of AC signals and for allowing transmission of DC signals. The N probes may be part of an end connector of a printed circuit board. The end connector may be connected to a bank of DC testing resources. The DC testing resources may include parametric measurement units. The N probes may be configured for operation in parallel.

The probe among the one or more probes may include a mechanism for enabling the conductor to move toward the signal trace or the pin to create the electrical connection, and to move away from the signal trace or the pin so that no electrical connection is created. The controller may include one or more processing devices for executing instructions to control the mechanism. The mechanism may include a magnetic coil to generate a magnetic field that interacts with the conductor to cause the conductor to move toward or away from the signal trace. The controller may be configured to control current through the magnetic coil to control the magnetic field. The mechanism may include an actuator connected to the conductor. The actuator may be configured to enable the conductor to move toward or away from the signal trace or the pin. The controller may be configured to provide an electrical signal to the actuator to control operation of the actuator. The actuator may include a plunger. The electrical connection may be formed by direct physical contact between the conductor and the signal trace.

Any two or more of the features described in this specification, including in this summary section, may be combined to form implementations not specifically described in this specification.

At least part of the devices, systems, and techniques described in this specification may be configured or controlled by executing, on one or more processing devices, instructions that are stored on one or more non-transitory machine-readable storage media. Examples of non-transitory machine-readable storage media include read-only memory, an optical disk drive, memory disk drive, and random access memory. At least part of the devices, systems, and techniques described in this specification may be configured or controlled using a computing system comprised of one or more processing devices and memory storing instructions that are executable by the one or more processing devices to perform various control operations. The devices, systems, and techniques described in this specification may be configured, for example, through design, construction, composition, arrangement, placement, programming, operation, activation, deactivation, and/or control.

The details of one or more implementations are set forth in the accompanying drawings and the following description. Other features and advantages will be apparent from the description and drawings, and from the claims.

DESCRIPTION OF THE DRAWINGS

Like reference numerals in different figures indicate like elements.

DETAILED DESCRIPTION

Described herein are example implementations of a probe for a test system. An example probe includes a conductor configured to pass low-frequency signals such as direct current (DC) signals between a DC testing resource and a signal trace in the test system. The signal trace is configured to pass the DC signals and also to pass high-speed signals, such as alternating current (AC) signals, to and from a device under test (DUT). In some examples, high-frequency signals have data transmission rates of 10 gigabits-per-second (Gbps) or greater, 20 Gbps or greater, 30 Gbps or greater, 40 Gbps or greater, 50 Gbps or greater, and so forth. However, "high-frequency" may be defined using different data transmission rates and frequencies than those presented herein. In the following description, "AC signals" are used as shorthand for high-frequency signals. "DC signals" is used as shorthand for low-frequency signals.

The probe includes an inductor connected in series with the conductor. The inductor is for inhibiting—for example, blocking—transmission of the AC signals and for allowing transmission of the DC signals. The inductor thus may prevent inherent or stray AC signals on the signal trace from reaching the DC testing resource. As a result, the DC testing resource may register less signal noise than it may otherwise register.

The probe includes a mechanism configured to enable the conductor to move toward the signal trace to create an electrical connection between the conductor and the signal trace that enables the DC testing resource to transmit the DC signals to the signal trace. The mechanism is also configured to enable the conductor to move away from the signal trace so that no electrical connection is created between the conductor and the signal trace when DC signals are not to be transmitted to the signal trace—for example, when AC testing is to be performed. Using the mechanism to disable or prevent the electrical connection during AC testing reduces the chances that the inductor on the probe will not distort AC test signals. For example, using the mechanism to disable or prevent the electrical connection physically during AC testing may ensure that the inductor on the probe will not distort AC test results.

Figure 1:
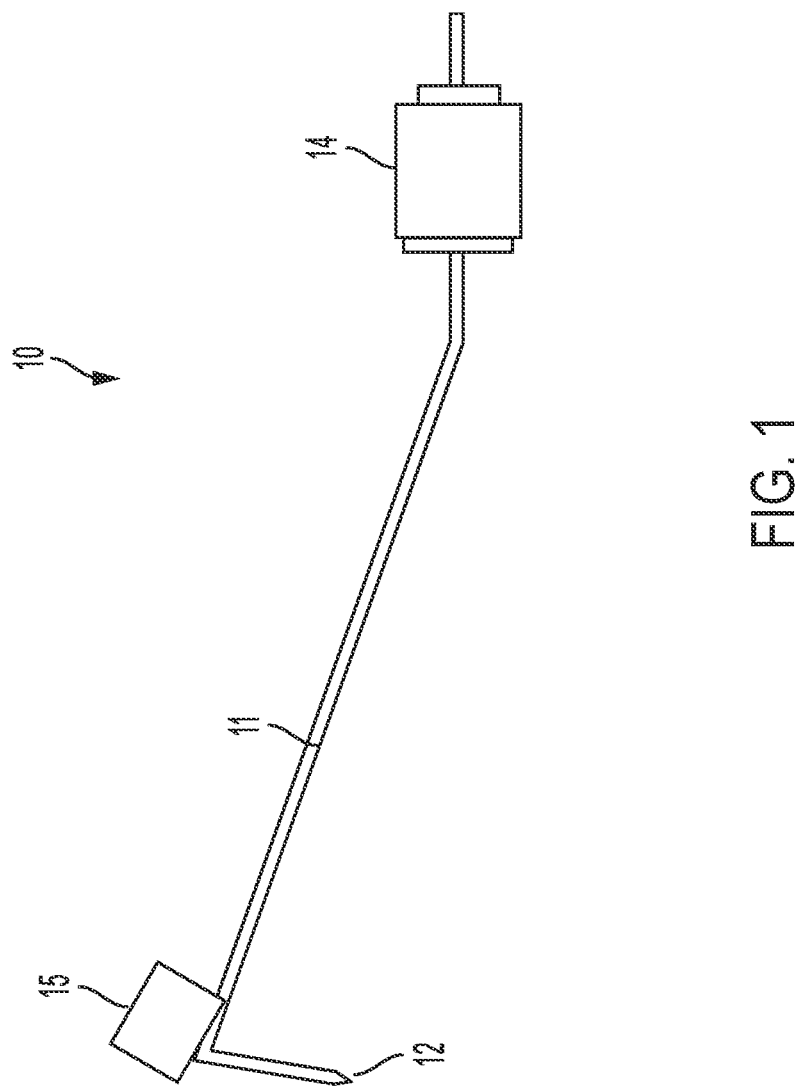
FIG. 1 is a diagram showing a side view of an example probe for a test system.

FIG. 1 shows an example implementation of a probe 10 of the type described in the preceding paragraphs. Probe 10 includes a conductor 11, such as copper, that terminates in a point 12. Point 12 is the region of probe 10 that contacts a signal trace or connector pin (described below with respect to FIG. 5) to create an electrical connection between the probe and the signal trace. The diameter of point 12 and the general size of probe 10 are based on the size of the signal trace or pin and, more generally, the size of the circuit board containing the signal trace. For example, smaller geometries may require smaller points and, generally, smaller probes.

Probe 10 also includes an inductor 14. Inductor 14 is connected electrically in series with conductor 11. Inductor may be any general-purpose inductive component, and need not be specially manufactured to implement the functions described herein. Inductor 14 may have an inductance in the range of nanohenries to microhenries. However, the inductance may vary for different circuit board configurations, connectors, and signals. Inductor 14 inhibits—for example, blocks transmission of or reduces transmission of—AC signals. Reductions in transmission of AC signals may depend on the size of the inductor—that is, the amount of inductance in the inductor—and the frequency of the signals. For example, 100% of the signals may be blocked, 90% of the signals may be blocked, 80% of the signals may be blocked, and so forth.

Probe 10 is movable to cause point 12 not to contact with a signal trace during AC testing, and to cause point 12 to contact with the signal trace during DC testing. To this end, probe 10 includes a mechanism 15 configured to cause conductor 11 to move away from, and break contact with, the signal trace when AC signals are applied to the signal trace by an AC testing resource. Mechanism 15 is also configured to cause conductor 11 to move toward, and into contact with, the signal trace when DC signals are applied to the signal trace by a DC testing resource. In some examples, mechanism 15 includes a magnetic coil to generate a magnetic field that interacts with conductor 11 to cause the conductor to move. For example, current is introduced into the magnetic coil that induces a magnetic field that produces physical movement of the conductor. When current is introduced, a magnetic field is generated that causes the conductor to move from its original position (where the magnetic coil is unstimulated) into contact with the signal trace. When that current is stopped/removed, the magnetic field dissipates, allowing the conductor to retract to its original position, thereby causing the conductor to break electrical and physical contact with the signal trace. In some implementations, an opposite current is applied to create a magnetic field that actively moves the conductor back to its original position for AC testing.

In some implementations, mechanism 15 is or includes an actuator connected to conductor 11. The actuator may be or include an electromechanical actuator that receives electrical signals and, in response, implements physical movement of the conductor. For example, the actuator may include a plunger-like structure that moves conductor 11 vertically—that is, up and down—relative to the signal trace on circuit board. The electrical signals input to the electromechanical actuator or the magnetic coil described above may be provided by, or output in response to commands from, a controller such as that described with respect to FIGS. 3 to 6 below. Thus, in effect, the controller also controls the conductor to move toward the signal trace to create an electrical connection between the conductor and the signal trace to enable the testing resource to transmit DC signals to the signal trace, and to move away from the signal trace so that no electrical connection is created between the conductor and the signal trace when the DC signals are not to be transmitted to the signal trace.

Figure 2:
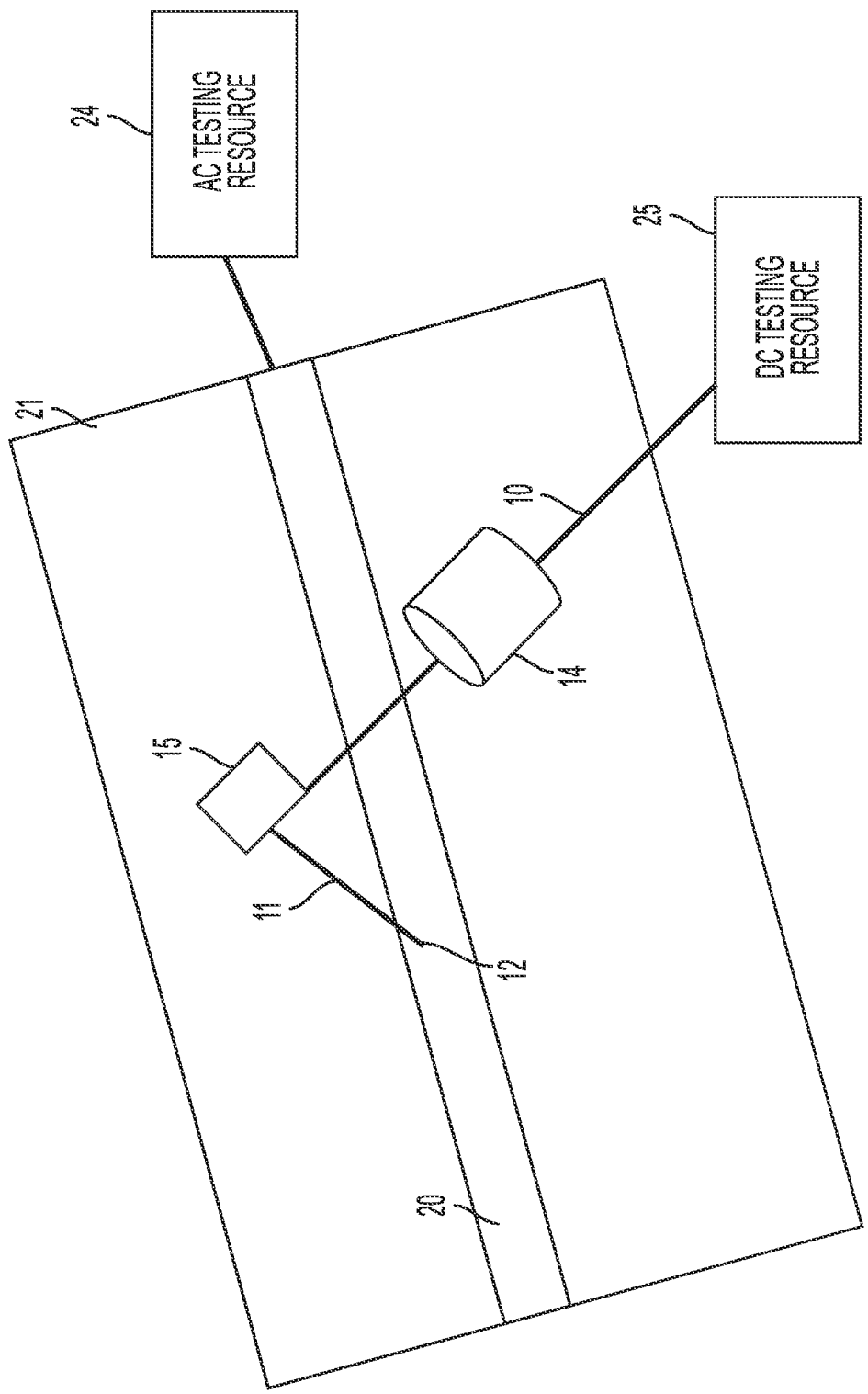
FIG. 2 is a diagram showing a perspective view of the probe of FIG. 1 connecting to a signal trace on a circuit board.

FIG. 2 shows probe 10 connecting physically and electrically to a signal trace 20 on a circuit board 21. Circuit board 21 may be a component of a test system, such as automatic test equipment (ATE), an example of which is described below. For example, circuit board 21 may be part of a device interface board (DIB), a probe interface board (PIB), or a test instrument such as a digital test instrument that is part of the test system. Signal trace 20 is an electrically conductive trace configured—for example, it has the size and composition—to transmit AC signals during AC testing of a DUT and to transmit DC signals during DC testing of the DUT. The AC signals may pass between signal trace 20 and an AC testing resource 24 such as a digital test instrument in the test system, and the DC signals may pass between signal trace 20 and a DC testing resource 25 such as a parametric measurement unit (PMU) in the test system.

Probe 10 is moved by mechanism 15 to cause point 12 to contact signal trace 20 during one type of testing, and to cause point 12 to contact with signal trace 20 during a different type of testing. For example, probe 10 is movable to cause point 12 to contact signal trace 20 physically and electrically during AC testing, and to cause point 12 to break physical and electrical contact with signal trace 20 during DC testing. In some implementations, the physical contact is direct—for example, there are no intervening components between conductor 11 and signal trace. In some implementations, the physical contact is indirect—for example, there are intervening components, such as one or more resistors, between conductor 11 and signal trace.

Inductor 14 passes DC signals, thereby allowing a DC testing resource such as a PMU to exchange DC signals with signal trace 20 through probe 10. Accordingly, during DC testing, probe 10 is moved into contact with signal trace 20 and DC signals are sent from the DC testing resource through probe 10 to the signal trace, and from the signal trace to the DC testing resource through probe 10. The DC signals sent from the DC testing resource to the signal trace may include test signals such as voltage or current, and the DC test signals from the signal trace to the DC testing resource may include measurements of voltage or current at DUT pins that are based on the test signals. The inductor 14 on the probe inhibits passage of AC signals in either direction during this DC testing. In this regard, a signal trace connected to a DUT in a test system may experience low-level AC signals even when there is no active AC signal transmission over the signal trace. These low-level AC signals are referred to as inherent AC signals. At the DC testing resource, these inherent AC signals register as noise and can affect the measurements performed by the DC testing resource. Inductor 14 blocks transmission of these inherent AC signals to the DC testing resource and, as a result, may reduce noise at, and increase the accuracy of, the DC testing resource.

During AC testing, AC test signals are output to signal trace 20 from AC testing resource 13 over signal trace 20, and AC response signal are sent from the DUT back to the AC testing resource over signal trace 20. Examples of AC testing signals include, but are not limited to, high-speed/high-frequency digital signals having a bitrate/frequency of 20 Gbps/10 Gigahertz (Ghz) or greater; however, the probe and the testing systems described herein are not limited to use with AC testing signals having these transmission characteristics. Inductor 14 may distort AC signals if left in electrical contact with signal trace 20. Consequently, if probe 10 were to remain in contact with signal trace 20 during AC testing, its inductor 14 could distort the AC test signals on signal trace 20. Accordingly, during AC testing, mechanism 15 controls probe 10 to physically disconnect from signal trace 20, that is, to move away from the signal trace as described above. This physical disconnection breaks the electrical connection between probe 10 and signal trace 20, thereby preventing, or reducing the chances of, inductor 14 from distorting the AC test signals during AC testing.

In some implementations, a circuit board containing a signal trace to be contacted by the probe may have limited space. Accordingly, the inductor may be located at a distance from the circuit board in order not to introduce an additional component into an already-crowded space. For example, the inductor may be located in the PMU or in an edge connector at an edge of the circuit board.

Figure 3:
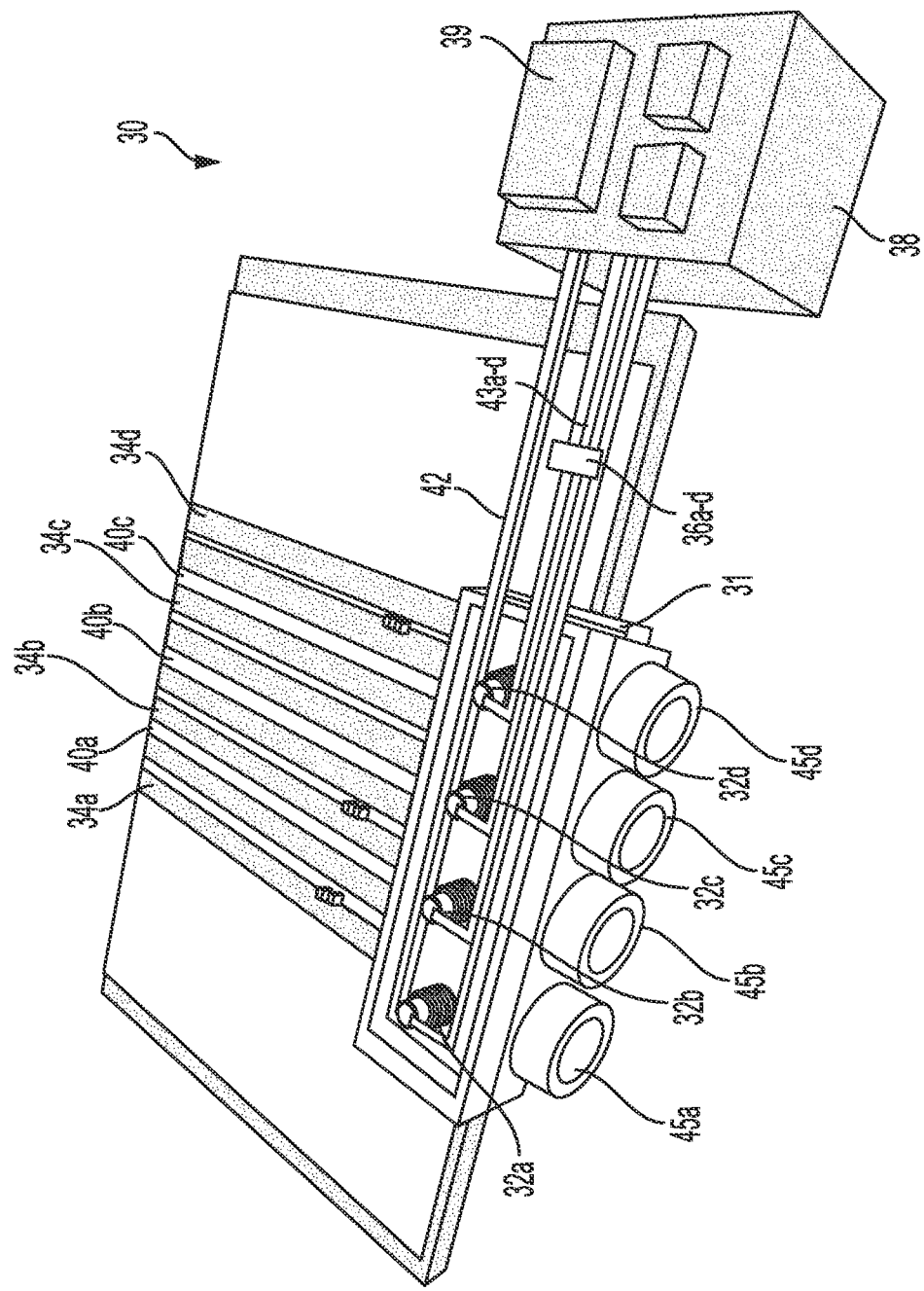
FIG. 3 is a diagram showing a back perspective view of an example system including a circuit board, an edge connector, probes, and a controller/testing resource.
Figure 4:
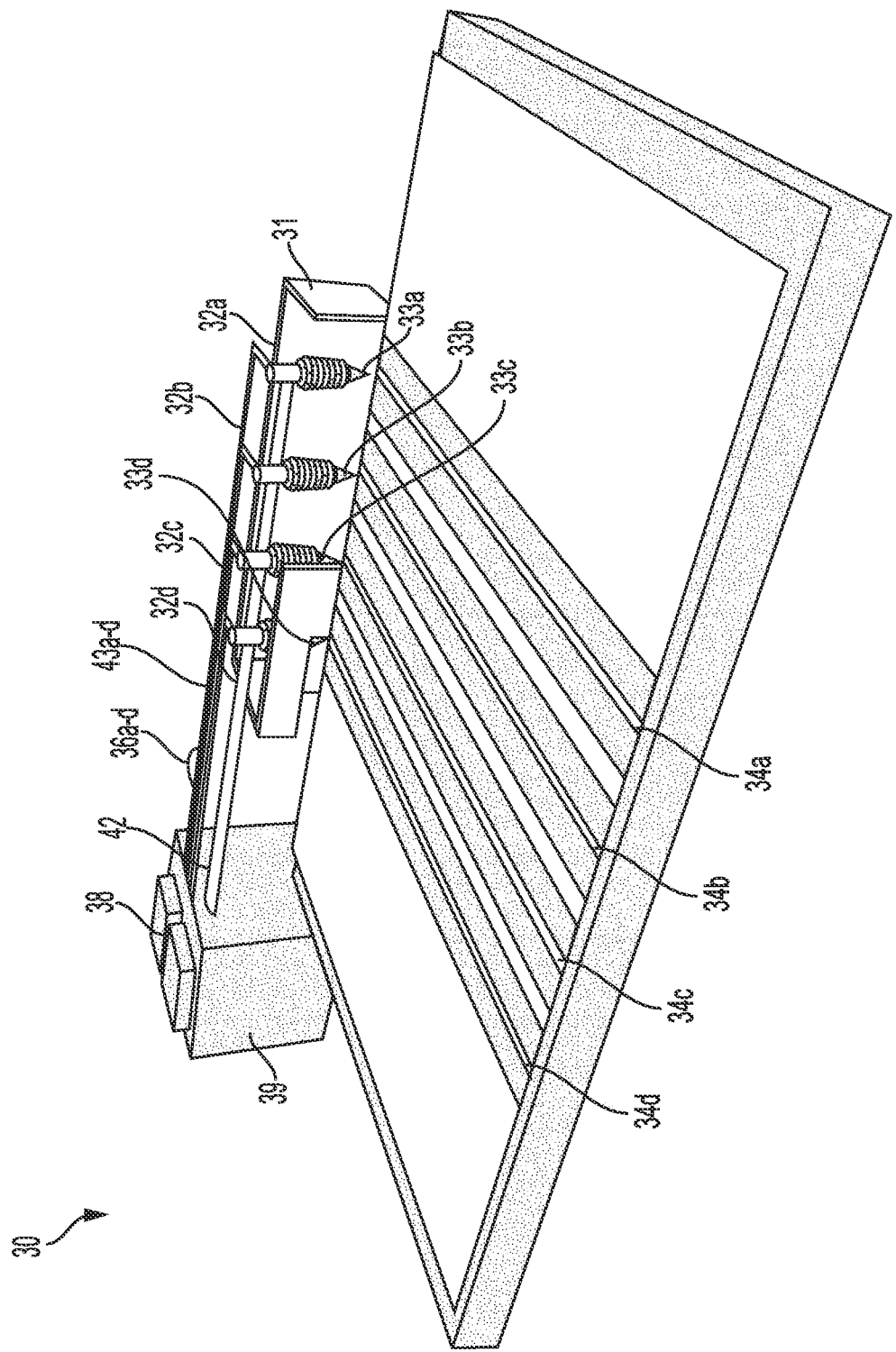
FIG. 4 is a diagram showing a front perspective view of the system of FIG. 3.

FIGS. 3 and 4 show an example system 30 containing an edge connector 31 having multiple probes 32a, 32b, 32c, and 32d arranged in parallel. Although four probes are shown, any number N of probes, where N is an integer greater than 1, may be include in such a configuration. Each of probes 32a to 32d may have the same or same general structure and function as the probe 10 described previously and with respect to FIGS. 1 and 2. In this regard, each of probes 32a to 32d includes a conductor 33a to 33d (FIG. 4) configured to carry DC signals between a DC testing resource and a respective signal trace 34a to 34d, and an inductor 36a to 36d connected in series with a respective conductor 33a to 33d. The inductors may be located at any point on the probes' conductors or inside the DC testing resource. The inductors 36a to 36d are located between PMU bank 38 and edge connector 31 in this example. Each of the inductors 36a to 36d is configured to inhibit—for example, to block—transmission of AC signals and to allow transmission of DC signals as described herein. The DC testing resources are part of PMU bank 38, which also includes a controller 39 for controlling operation of the probes to contact, or to break contact with, respective signal traces. Each of the probes 32a to 32d may be configured to contact and break contact from a respective signal trace as described above or may be configured to contact and break contact with a respective pin on the edge connector as described below.

In FIGS. 3 and 4, each signal trace 34a to 34d capable of carrying AC and DC signals is separated from its adjacent signal trace by a DC grounded trace 40a to 40c (FIG. 3). Individual probes 32a to 32d may be controlled by control line 42 between controller 39 and the magnetic or electromechanical mechanism for controlling movement of a corresponding probe. Also shown are signal lines 43a to 43d that provide signal paths between a respective PMU in PMU bank 38 and a respective probe. In the implementation of FIGS. 3 and 4, DC signals are sent to and from the DC testing resource—the PMU bank 38 in this example—and signal traces 34a to 34d via signal lines 43a to 43d. AC signals are sent via connectors 45a to 45d on edge connector 31 (FIG. 3). The AC signals are sent to and from an AC testing resource, such as a digital test instrument described herein.

Figure 5:
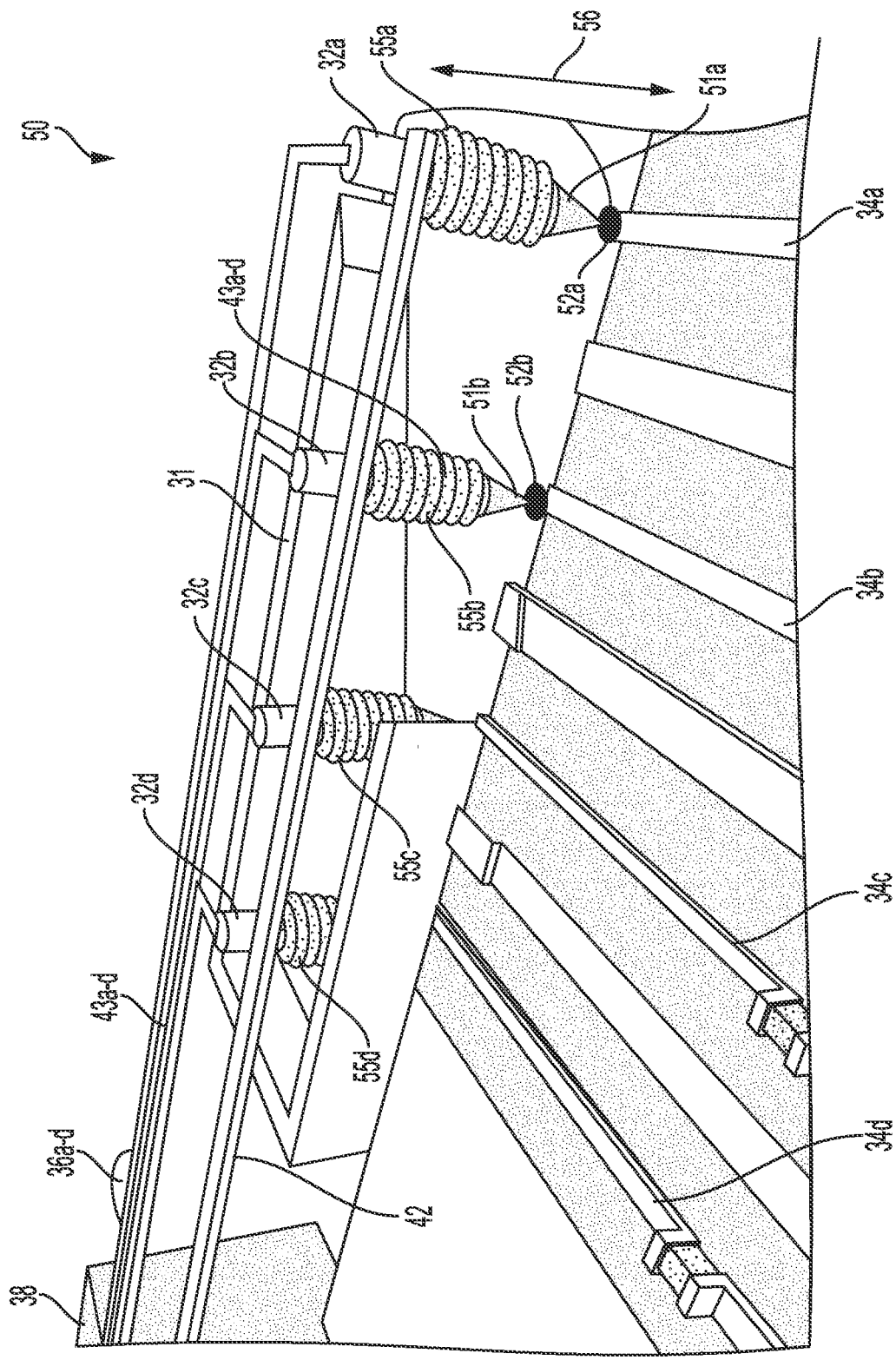
FIG. 5 is a diagram showing a cut-away front perspective view of an example system including a circuit board, an edge connector, probes, and a controller/testing resource.

FIG. 5 shows an implementation of the configuration shown in FIGS. 3 and 4. In FIG. 5, system 50 integrates probes 32a to 32d in a "bed of nails" style configuration as part of a high-speed connector 31 used to deliver AC signals to a DIB and to transmit AC signals from the DIB. In this example, the hardware could include a standard reusable connector in which the probes are operated in parallel to contact signal pins of edge connector 31 rather than the signal traces themselves. This may have the advantage of not using circuit board area and allowing for a more rugged structure.

More specifically, in system 50, each pin 51a and 51b (only two of the four present are visible) of edge connector 31 connects physically and electrically to a corresponding signal trace 34a and 34b. In this example, rather than connecting to the trace itself, the probes 32a to 32d connect physically and electrically (either directly or indirectly) to a corresponding pin 52a, 52b that connects electrically to a signal trace. Thus, an electrical connection is still made between each probe and respective signal trace; however, that electrical connection is made through the edge connector pins.

The remaining features of system 50 may be identical to those described with respect to system 30. In this regard, FIG. 5 also shows control line 42 that carries signals to control movement of respective probes 32a to 32d. In this example, as in FIGS. 3 and 4, the control line 42 is shared such that the probes' movement is concurrent or in tandem. In some implementations, there may be a different control line for each probe allowing independent control thereof. In some implementations, the probes may be addressable over the shared control line, thereby enabling independent control over their movement. In this example, control line 42 connects electrically to, and sends control signals to, actuators 55a to 55d. In this example, actuators 55a to 55d are plunger-like actuators that enable vertical/up-and-down movement of respective probe conductors in the directions of arrows 56.

FIG. 5 also shows inductors 36a to 36d mounted on respective signals lines 43a to 43d between PMU bank 38 and respective probes 32a to 32d. As noted, in alternative implementations, the inductors may be located in the PMUs themselves or the inductors may be located within the edge connector 31.

Figure 6:
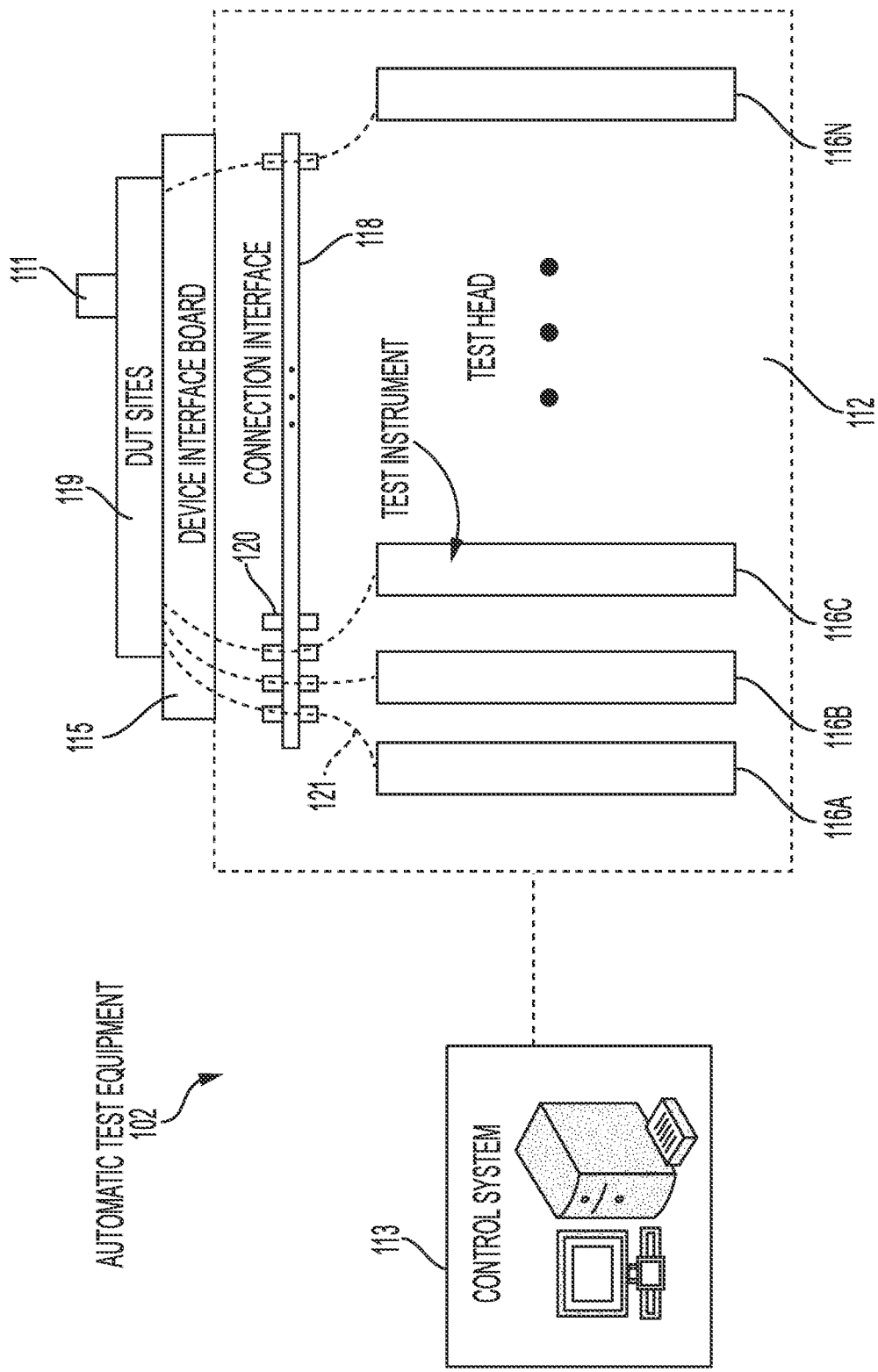
FIG. 6 is a block diagram showing components of an example test system on which the example probes described herein may be used.

FIG. 6 shows components of example automatic test equipment (ATE) 102 having probes and/or circuit board systems of the types described with respect to FIGS. 1 to 5 above. For example, the circuit boards including probes and, in some examples circuit boards having edge connectors that include the probes (e.g., FIGS. 3 to 5), may be part of the ATE's DIB or part of a digital or other test instrument in the ATE.

ATE 102 includes a test head 112 and a control system 113. The control system may include a computing system comprised of one or more microprocessors or other appropriate processing devices as described herein. Controller 39 (FIGS. 3 and 4) may be, or be part of, control system 113. DIB 115 includes a circuit board that may include the probes described herein or edge connector(s) containing the probes. DIB is connected to test head 112 and includes mechanical and electrical interfaces at sites 111 to one or more DUTs, such as DUT 111, that are being tested or are to be tested by the ATE. Power, including voltage, may be run via one or more layers in the DIB to DUTs connected to the DIB. DIB 115 also may include one or more ground layers and one or signal layers with connected vias for transmitting signals to the DUTs.

Test signals and response signals, such as AC digital signals, and other types of signals pass via test channels to the sites between the DUTs and various test instruments over DIB 115 DIB 115 may also include, among other things, connectors, conductive traces, conductive layers, and circuitry for routing signals between the test instruments, DUTs connected to sites 119, and other circuitry.

Control system 113 communicates with components included in the test head to control testing and probe operation. For example, control system 113 may download test program sets to test instruments 116A to 116N in the test head. In an example, a test program generates a test pattern (or flow) to provide to the DUT. The test pattern is written to output test signals to elicit a response from the DUT, for example. As noted, the test signals and the response from the DUT may include digital signals.

The test instruments include hardware devices that may include one or more processing devices and other circuitry. Test instruments 116A to 116N may run the test program sets to test DUTs held on the DIB and in communication with the test instruments via the DIB. Control system 113 may also send, to test instruments in the test head, instructions, test data, and/or other information that is usable by the test instruments to perform appropriate tests on DUTs interfaced to the DIB. In some implementations, this information may be sent via a computer or other type of network or via a direct electrical path. In some implementations, this information may be sent via a local area network (LAN) or a wide area network (WAN).

ATE 102 includes multiple test instruments 116A to 116N, each of which may be configured, as appropriate, to perform one or more of testing and/or other functions. Although only four test instruments are depicted, the system may include any appropriate number of test instruments, including those residing outside of test head 112. Test instrument 116A may be configured to output AC digital signals to test a DUT based, e.g., on data provided by the control system, and to receive AC digital response signals from the DUT. To this end, test instrument 116A may include a system 30 or 50, including a circuit board, an edge connector, and a set of probes 32a to 32d arranged in parallel as described with respect to FIGS. 3 to 5. In addition, test instrument 116A may include a PMU bank of the type the type shown in FIGS. 3 to 5 to perform DC tests using probes 32a to 32d during times when AC testing is not performed. These features may also be included on other test instruments 116.

Signals, including AC and DC signals, may be sent to, and received from, the DUT over multiple test channels or other electrically conductive media. In some examples, a test channel may include the physical transmission medium or media over which signals are sent from the test instrument to a DUT and over which signals are received from the DUT. Physical transmission media may include, but are not limited to, electrical conductors alone or in combination with optical conductors, wireless transmission media, or both optical conductors and wireless transmission media. In some examples, a test channel may include a range of frequencies over which signals are transmitted over one or more physical transmission media.

In some examples, ATE 102 includes a connection interface 118 that connects test instrument test channels 121 to DIB 115. Connection interface 118 may include connectors 120 for routing signals between the test instruments and DIB 115. The connection interface may include one or more circuit boards or other substrates on which such connectors are mounted. Conductors that are included in the test channels may be routed through the connection interface and the DIB.

Although the implementations described herein are in the context of testing, the probes described herein may be used outside of a testing context. For example, the probes may be used to provide DC signals on any AC transmission line.

All or part of the test systems and processes described in this specification and their various modifications may be configured or controlled at least in part by one or more computers such as control system 113 using one or more computer programs tangibly embodied in one or more information carriers, such as in one or more non-transitory machine-readable storage media. A computer program can be written in any form of programming language, including compiled or interpreted languages, and it can be deployed in any form, including as a stand-alone program or as a module, part, subroutine, or other unit suitable for use in a computing environment. A computer program can be deployed to be executed on one computer or on multiple computers at one site or distributed across multiple sites and interconnected by a network.

Actions associated with configuring or controlling the test system and processes described herein can be performed by one or more programmable processors executing one or more computer programs to control or to perform all or some of the operations described herein. All or part of the test systems and processes can be configured or controlled by special purpose logic circuitry, such as, an FPGA (field programmable gate array) and/or an ASIC (application-specific integrated circuit) or embedded microprocessor(s) localized to the instrument hardware.

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, such as magnetic, magneto-optical disks, or optical disks. Non-transitory machine-readable storage media suitable for embodying computer program instructions and data include all forms of non-volatile storage area, including by way of example, semiconductor storage area devices, such as EPROM (erasable programmable read-only memory), EEPROM (electrically erasable programmable read-only memory), and flash storage area devices; magnetic disks, such as internal hard disks or removable disks; magneto-optical disks; and CD-ROM (compact disc read-only memory) and DVD-ROM (digital versatile disc read-only memory).

Elements of different implementations described may be combined to form other implementations not specifically set forth previously. Elements may be left out of the systems described previously without adversely affecting their operation or the operation of the system in general. Furthermore, various separate elements may be combined into one or more individual elements to perform the functions described in this specification.

Other implementations not specifically described in this specification are also within the scope of the following claims.

What is claimed is:

1. A probe for a test system, the probe comprising:
    a conductor configured to carry direct current (DC) signals between a DC testing resource and a signal trace on the test system, the signal trace for carrying the DC signals and alternating current (AC) signals to and from a device under test (DUT);
    an inductor connected in series with the conductor, the inductor for inhibiting transmission of the AC signals and for allowing transmission of the DC signals; and
    a mechanism for enabling the conductor to move toward the signal trace or a pin electrically connected to the signal trace to create an electrical connection between the conductor and the signal trace to enable the testing resource to transmit the DC signals to the signal trace, and to move away from the signal trace or the pin so that no electrical connection is created between the conductor and the signal trace when the DC signals are not to be transmitted to the signal trace enabling transmission of the AC signals to and from the DUT, where the mechanism is configured to cause the conductor to create or to break the electrical connection with the signal trace or pin.

2. The probe of claim 1, wherein the inductor is configured to block the AC signals on the conductor.

3. The probe of claim 1, wherein the mechanism is configured to enable the conductor to move away from the signal trace or the pin when the AC signals are applied to the signal trace by an AC testing resource.

4. The probe of claim 1, wherein the mechanism comprises a magnetic coil to generate a magnetic field that interacts with the conductor to cause the conductor to move toward or away from the signal trace or the pin.

5. The probe of claim 1, wherein the mechanism comprises an actuator connected to the conductor, the actuator being configured to enable the conductor to move toward or away from the signal trace or the pin.

6. The probe of claim 1, wherein the inductor is part of the DC testing resource.

7. The probe of claim 1, wherein the probe is part of an edge connector to a printed circuit board (PCB), the PCB containing the signal trace.

8. The probe of claim 1, wherein the PCB is a device interface board (DIB), is part of a module connected to the DIB, or is part of a test instrument in the test system.

9. The probe of claim 1, wherein the electrical connection is formed by physical contact between the conductor and the signal trace.

10. The probe of claim 1, wherein the AC signals are at 20 gigabits-per-second (Gbps)/10 gigahertz (GHz) or greater.

11. A test system comprising:
    a direct current (DC) testing resource for exchanging DC signals with a device under test (DUT) over a signal trace;
    an alternating current (AC) testing resource for exchanging AC signals with the DUT over the signal trace; and
    one or more probes, where a probe comprises:
        a conductor configured to carry the DC signals between the DC testing resource and the signal trace;
        an inductor connected in series with the conductor, the inductor for inhibiting transmission of the AC signals and for allowing transmission of the DC signals; and
        a controller for controlling the conductor to move toward the signal trace or a pin electrically connected to the signal trace to create an electrical connection between the conductor and the signal trace to enable the testing resource to transmit the DC signals to the signal trace, and to move away from the signal trace or the pin so that no electrical connection is created between the conductor and the signal trace when the DC signals are not to be transmitted to the signal trace enabling transmission of the AC signals to and from the DUT, where controlling the conductor comprises controlling a mechanism to cause the conductor to create or to break the electrical connection with the signal trace or pin.

12. The test system of claim 11, wherein the one or more probes comprises N (N>1) probes, each of the N probes comprising:
  an $N^{th}$ conductor configured to carry DC signals between an $N^{th}$ DC testing resource and an $N^{th}$ signal trace; and
  an $N^{th}$ inductor connected in series with the $N^{th}$ conductor, the $N^{th}$ inductor for inhibiting transmission of AC signals and for allowing transmission of DC signals.

13. The test system of claim 12, wherein the N probes are part of an end connector of a printed circuit board, the end connector being connected to a bank of DC testing resources, the DC testing resources comprising parametric measurement units.

14. The test system of claim 12, wherein the N probes are configured for operation in parallel.

15. The test system of claim 11, wherein the probe comprises:
  the mechanism for enabling the conductor to move toward the signal trace or the pin to create the electrical connection, and to move away from the signal trace or the pin so that no electrical connection is created.

16. The test system of claim 15, wherein the controller comprises one or more processing devices for executing instructions to control the mechanism.

17. The test system of claim 15, wherein the mechanism comprises a magnetic coil to generate a magnetic field that interacts with the conductor to cause the conductor to move toward or away from the signal trace; and
  wherein the controller is configured to control current through the magnetic coil to control the magnetic field.

18. The test system of claim 15, wherein the mechanism comprises an actuator connected to the conductor, the actuator being configured to enable the conductor to move toward or away from the signal trace or the pin; and
  wherein the controller is configured to provide an electrical signal to the actuator to control operation of the actuator.

19. The test system of claim 18, wherein the actuator comprises a plunger.

20. The test system of claim 11, wherein the electrical connection is formed by direct physical contact between the conductor and the signal trace.

* * * * *